United States Patent [19]

Miranda

[11] Patent Number: 5,393,347
[45] Date of Patent: Feb. 28, 1995

[54] METHOD AND APPARATUS FOR REMOVABLE WEIR OVERFLOW BATH SYSTEM WITH GUTTER

[75] Inventor: Henry R. Miranda, Milpitas, Calif.

[73] Assignee: PCT Systems, Inc., Fremont, Calif.

[21] Appl. No.: 734,643

[22] Filed: Jul. 23, 1991

[51] Int. Cl.$^6$ .............................................. B05C 3/00
[52] U.S. Cl. ................... 118/429; 134/902; 118/500; 118/501
[58] Field of Search .................. 118/501, 500, 429; 134/902, 135, 186; 4/507–512

[56] References Cited

U.S. PATENT DOCUMENTS

| | | | |
|---|---|---|---|
| 4,023,217 | 5/1977 | Kessler | 4/510 |
| 4,121,307 | 10/1978 | Patterson | 4/509 |
| 4,955,402 | 9/1990 | Miranda | 134/902 |
| 5,054,519 | 10/1991 | Berman | 118/429 |

FOREIGN PATENT DOCUMENTS

| | | | |
|---|---|---|---|
| 0263634 | 11/1987 | Japan | 134/902 |
| 0279640 | 12/1987 | Japan | 134/902 |
| 1057624 | 3/1989 | Japan | . |
| 1262627 | 10/1989 | Japan | 134/902 |
| 0098931 | 4/1990 | Japan | 134/902 |
| 3250732 | 11/1991 | Japan | . |
| 3295224 | 12/1991 | Japan | . |
| 4049619 | 2/1992 | Japan | . |
| 4074420 | 3/1992 | Japan | 134/902 |
| 4124824 | 4/1992 | Japan | . |
| 4172530 | 4/1992 | Japan | 134/902 |

*Primary Examiner*—W. Gary Jones
*Assistant Examiner*—Brenda Lamb
*Attorney, Agent, or Firm*—Townsend and Townsend Khourie and Crew

[57] ABSTRACT

The present invention provides a method and apparatus for a removable weir overflow bath system with gutter which decreases manufacturing costs and increases user flexibility. Manufacturing costs are decreased by forming a weld with a low probability of breakage. Because breakage probability is low material costs and labor costs resulting from bath system manufacture is reduced. Furthermore, the present invention offers increased flexibility since the user need only replace the removable weir to change the scallop characteristics and obtain a new bath system. The preferred embodiment of the present invention includes a four-sided removable weir and a quartz container with gutter. The gutter region of the container is formed by welding a member of an L-shaped quartz structure to the top edge of an open top rectangular quartz container. A resilient material is placed on top of the gutter region along the corner formed by the gutter region and quartz container. The removable weir is placed on top of the resilient material. Pressure is applied to the top of the removable weir so that the resilient material conforms to and forms a seal between the sides and bottom of the removable weir and the gutter region.

2 Claims, 4 Drawing Sheets

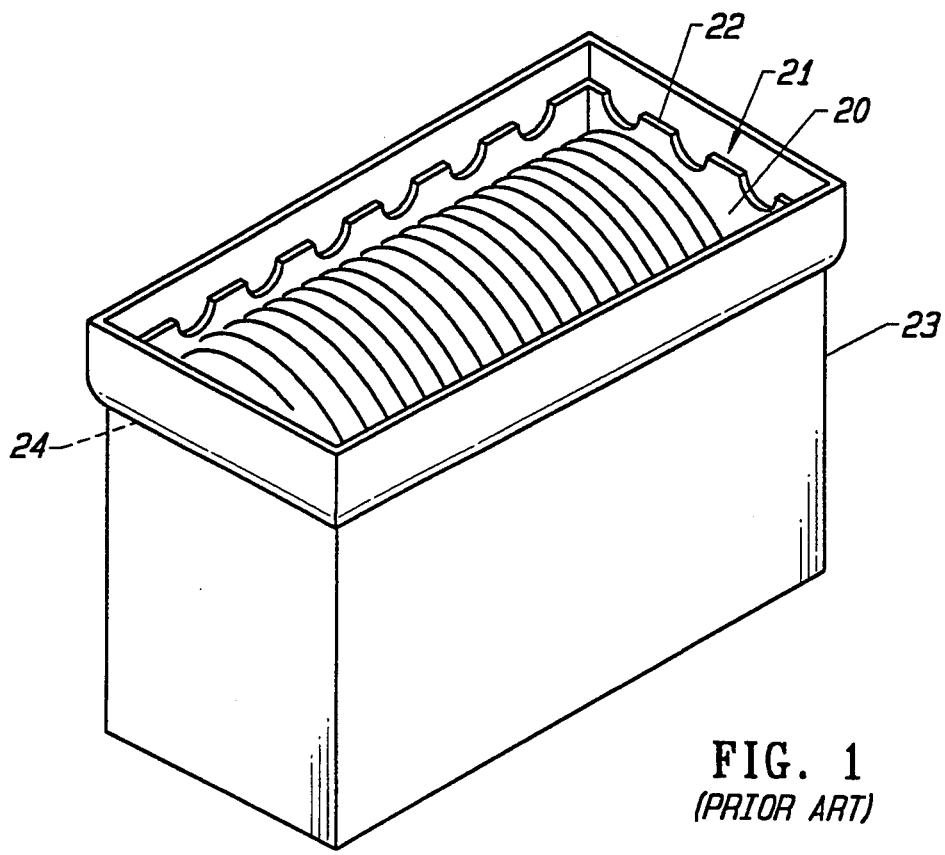
FIG. 1
(PRIOR ART)
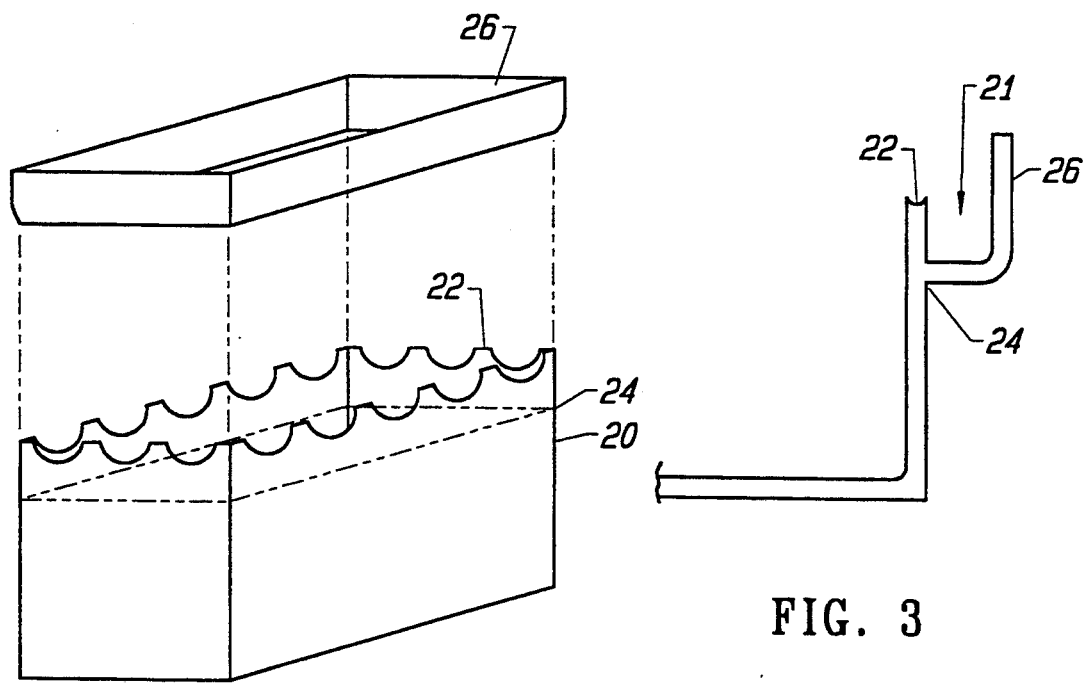
FIG. 2
(PRIOR ART)
FIG. 3

METHOD AND APPARATUS FOR REMOVABLE WEIR OVERFLOW BATH SYSTEM WITH GUTTER

FIELD OF THE INVENTION

This invention is related to the field of filtered constant temperature baths for semiconductor manufacturing.

BACKGROUND OF THE INVENTION

During the manufacture of semiconductor devices, materials which have been deposited on the face of the semiconductor wafer must be removed. Typically these surface materials are removed through the use of a standard chemical bath system consisting of an open rectangular quartz container filled with a chemical solvent or etchant, such as acid. Performance of the standard chemical bath system is limited by the continual need to replace the chemical solvent as the solvent becomes contaminated. Filtered constant bath systems offer increased performance over standard bath systems by reducing the time and volume of chemicals necessary for replacing contaminated solvent in a standard bath system. In a filtered bath system, the solvent typically is pumped from the tank through a drain and passed through a filter to remove the unwanted particulate contaminants.

One filtered bath system is the fixed weir overflow bath system with gutter illustrated in FIG. 1. The fixed weir bath system with gutter is typically manufactured by welding an L-shaped quartz structure (the gutter) to the top of a rectangular quartz container. Although the bath system is a single container, the container can be divided into an upper and lower tank region. The open quartz container forms the lower tank region and is used for wafer processing. The L-shaped quartz structure welded to the quartz container forms the upper tank or gutter region.

The first step in manufacturing the fixed weir bath system with gutter is to scallop the open top edge of the rectangular quartz container. This scalloping procedure is typically performed by a laser. The scallop shape determines the fluid flow characteristics of the bath system. Next, the upper tank or gutter region is formed by welding an L-shaped quartz structure to the scalloped lower tank region. The weld of the L-shaped structure to the lower tank region must be slightly below the bottommost edge of the scallops. By positioning the weld below the scalloped edge of the lower tank region, fluid can flow over the scalloped edging from the lower tank processing region into the upper tank gutter region.

In operation the fixed weir bath system with gutter is filled with solvent. As more solvent is pumped into the container, solvent overflows the scalloped edges of the lower tank processing region into the upper tank or gutter region. Particulate which fall onto the surface of the solvent are trapped by the surface tension and removed by the overflow action into the gutter before the particulate can sink into the liquid and contaminate the solvent. The gutter region has a drain through which the solvent is removed, filtered and pumped back into the container.

Although the fixed weir bath system with gutter offers good performance it is expensive to manufacture. Welding the L-shaped structure to the quartz container to form a gutter produces a weak weld which is prone to breakage. Breakage occurring at this point in the manufacture process adds greatly to manufacturing costs. Material costs are increased since the quartz rectangular container and gutter structure cannot be salvaged. Furthermore, disposal of the bath system is especially expensive at this point in the manufacture since labor costs from scalloping the quartz container and welding the gutter region have already been incurred and must be added to the bath system cost.

Another disadvantage of the fixed weir overflow bath is its lack of flexibility. The scalloped edges of the lower tank region cannot be changed once the bath system has been manufactured. Thus, if new processing characteristics are desired, the user must replace the entire bath system instead of simply replacing the scallops. This replacement of bath systems is especially expensive when the user is in the process development stage and is experimenting to determine the optimal scallop characteristics for a new semiconductor wafer process.

SUMMARY OF THE INVENTION

The present invention provides a method and apparatus for a removable weir overflow bath system with gutter which decreases manufacturing costs and increases user flexibility. Manufacturing costs are decreased by forming a weld with a low probability of breakage. Because breakage probability is low material costs and labor costs resulting from bath system manufacture is reduced. Furthermore, the present invention offers increased flexibility since the user need only replace the removable weir to change the scallop characteristics. Other bath systems require replacement of the entire bath system to change scallop characteristics.

The preferred embodiment of the present invention includes a four-sided removable weir and a quartz container with gutter. The gutter region of the container is formed by welding a member of an L-shaped quartz structure to the top of an open top rectangular quartz container. A resilient material is placed on top of the gutter region along the corner where the gutter region is welded to the quartz container. A removable weir is placed on top of the resilient material. Pressure is applied to the top of the removable weir so that the resilient material conforms to and forms a seal between the sides and bottom of the removable weir and the gutter region.

Operation of the present invention is similar to the fixed weir bath system with gutter. Solvent is pumped into the processing region. As more solvent is pumped into the processing region fluid overflows the top edges of the removable weir and flows into the gutter region. Contaminating particles which fall onto the surface of the solvent are trapped by the surface tension of the fluid. The overflow action moves surface contaminants from surface of the processing region into the gutter region where contaminants are drained and filtered from the bath system.

BRIEF DESCRIPTION OF THE DRAWINGS

A more detailed understanding of the present invention can be achieved by perusing the PREFERRED EMBODIMENTS OF THE PRESENT INVENTION and the following drawings:

FIG. 1 is a perspective view of the container and semiconductor wafers in a fixed weir overflow bath system with gutter.

FIG. 2 is an exploded view of the fixed weir overflow bath system with gutter.

FIG. 3 is a cross-sectional view of the fixed weir overflow bath system with gutter.

PREFERRED EMBODIMENT OF THE PRESENT INVENTION

Figure 4:
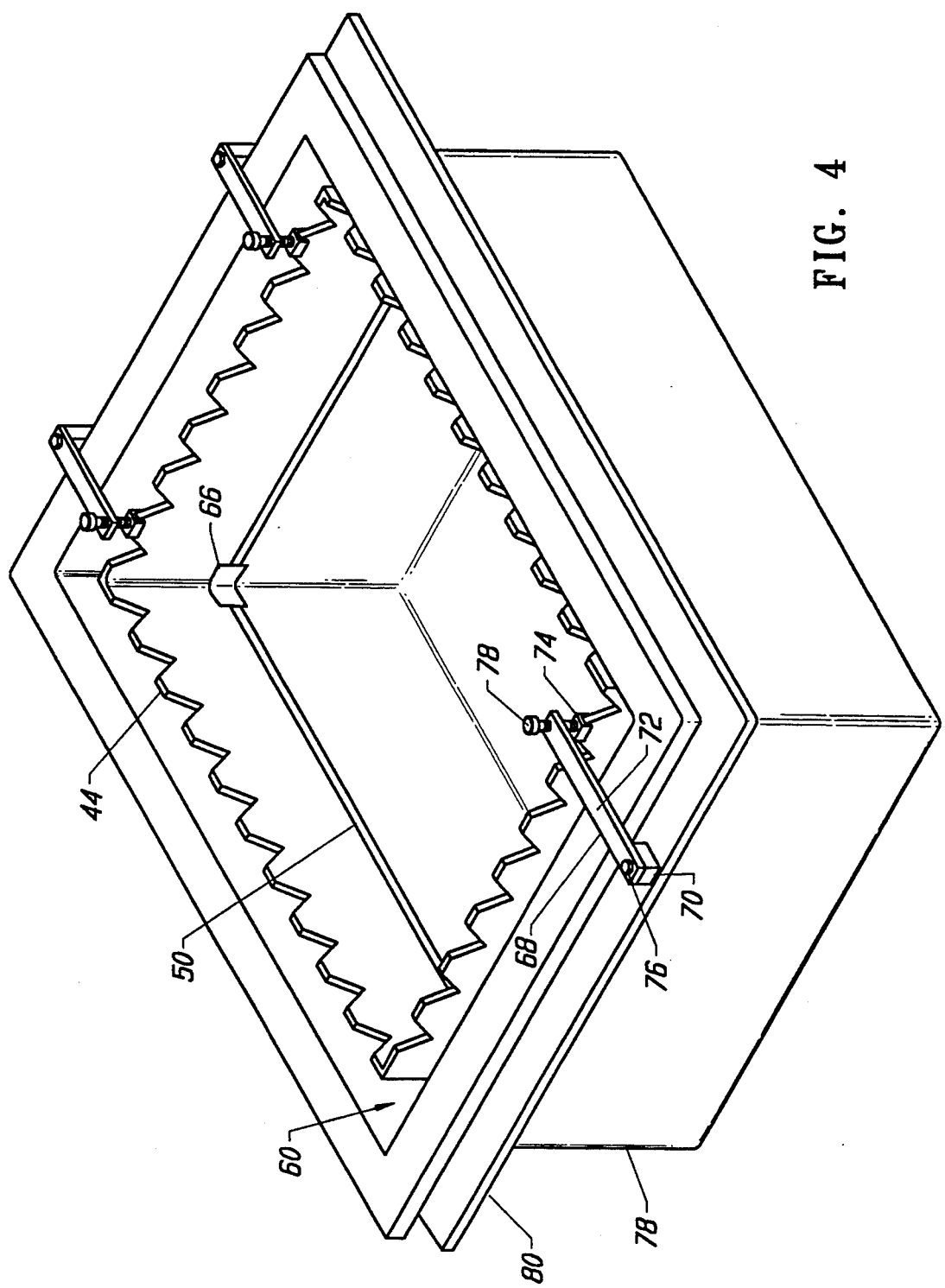
FIG. 4 is a perspective view of the removable weir bath system with gutter according to the present invention.

A perspective view of the fixed weir bath system with gutter is illustrated in FIG. 1. The fixed weir bath system has a lower tank region 20 where semiconductor wafer processing occurs and an upper tank or gutter region 21 where fluid overflow and drainage occurs. In manufacturing the bath system the lower tank region of the bath system is formed first. Typically the lower tank region 20 is composed of quartz, is rectangular and has an open top side. The open top side of the lower tank region is scalloped by a laser to conform to the desired process characteristics.

The second step in the manufacture of the fixed weir bath system with gutter is welding an L-shaped structure 26 to the scalloped lower tank region 20 to form a gutter region. The gutter region 21 of the tank is formed by welding a member of an L-shaped quartz structure 26 to lower tank region 20. The positioning of the weld of the gutter region to the rectangular quartz container is more clearly illustrated in the exploded view shown in FIG. 2. The weld 24 to the inner tank region 20 is positioned such that one member of the L-shaped structure 26 contacts the inner tank so that it abuts the lower tank region 20 at a 90° angle. This means that the member of the L-shaped structure 26 in direct physical contact with the lower tank region 20 is substantially perpendicular (90° angle) to the contacting side of the inner tank 20, while the second member of the L-shaped structure 26 is substantially parallel (180° angle) to the contacting side of the inner tank region 20. The weld 24 to the lower tank region 20 of the container is beneath the bottommost edge of the scalloped edges 22 of the lower tank region. By positioning the weld 24 beneath the bottom of the scalloped edge 22, the gutter 21 is below the scalloped edge 22 of the lower tank region 20 and liquid may flow across the scalloped edges 22 of the lower tank 20 into the gutter region 21. The top of the gutter region (the top of the L-shaped member parallel to the contacting side of the lower tank 20) must be higher than the top scalloped edge of the lower tank 20. Otherwise fluid flowing over the top edges of the scallops would spill outside the container.

In operation the lower tank 20 is filled with a chemical such as sulfuric acid. As more solvent is pumped into the lower tank 20 the solvent overflows the scalloped edges 22 of the lower tank 20 into the gutter region 21. The scalloped edges 22 increase the velocity of the solvent as it overflows the lower tank region 20. Particulate, which typically contaminate the solvent by falling onto the surface of the solvent, are trapped by the surface tension and are removed by the overflow action into the gutter 21 before the particulate can sink into the liquid and contaminate the solvent. The gutter region 21 has a drain (not shown) through which solvent is removed, filtered and pumped back into the inner container.

Figure 5:
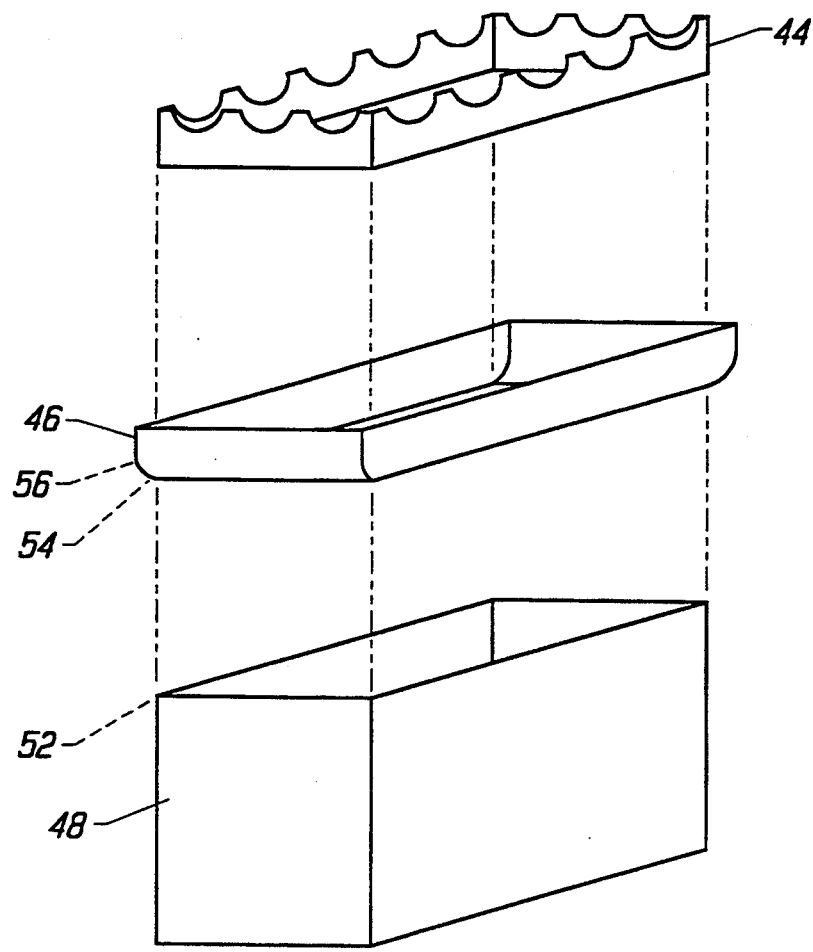
FIG. 5 is an exploded view of the removable weir overflow bath system with gutter according to the present invention.

A perspective view of an embodiment of the present invention 40 is shown in FIG. 4. The present invention includes an outer container with gutter 42 and a removable weir 44. Referring to FIGS. 4 and 5, the gutter region 60 of the outer container with gutter 42 is formed by welding a member of an L-shaped quartz structure 46 to the top of an open top quartz container 48. A resilient material 50 is placed on top of the gutter region along the corner where the L-shaped structure 46 is welded to the quartz container 48. The removable weir 44 is placed on top of the resilient material 50. Pressure is applied to the top of the removable weir 44 so that the resilient material 50 conforms to the bottom and sides of the removable weir 44 and gutter region forming a water tight seal.

The manufacture of the removable weir overflow bath system with gutter typically starts with the construction of the removable weir 44. To form the removable weir 44 an open top rectangular quartz container is cut some distance below the top of container. The cut to the quartz container is typically made parallel to the top of the container. The result is two separate structures: a first rectangular structure with an open top and open bottom (the removable weir) and a second open top closed rectangular container. The newly formed open top container 48 is similar to the old container except the height of the sides is reduced. The open top and open bottom rectangular structure is used as a weir during bath system operation and hereinafter will be referred to as the removable weir 44. The distance from the top of the container to the cut made in the original quartz container determines the height of the removable weir 44. The top edge of the removable weir 44 is at a later time scalloped to conform to the desired process characteristics.

In one embodiment of the present invention, a second member is welded to the side of the removable weir 44. Typically the second member is welded at a 90° angle forming an L-shaped foot 45. Adding an L-shaped foot to the weir bottom increases the surface area of the weir 44 which is in contact with the resilient material 50. Increasing the surface area of the weir bottom in contact with the resilient material 50 improves the seal formed between the removable weir 44 and corner edge 62 of the outer container and improves the stability of the removable weir 44.

The remaining rectangular quartz container 48 with open top side is used in constructing the outer container with gutter 42. Referring to FIG. 5, the gutter region of the bath system is formed by welding the L-shaped quartz structure 46 to the open top side 52 of the rectangular quartz container 48. The two structures are positioned so that one member of the L-shaped structure 54 makes a 90° angle with the top of the quartz container 48. This means that the member 54 of the L-shaped structure contacting the quartz container 48 is generally perpendicular to the contacted side of the quartz container while the other member 56 of the structure is generally parallel to the contacted side of the container. The position of the weld 52 is different from the weld made in the fixed weir bath system with gutter illustrated in FIGS. 1-3. In the fixed weir bath system, the weld to the rectangular quartz container is made some distance below the top of the quartz container (see FIG. 2) instead of at the top of the quartz container 52 as in the present invention.

Before welding occurs, the L-shaped structure 46 is positioned so that it contacts the top 52 of the quartz container. In the preferred embodiment, the L-shaped structure 46 is positioned so that it sits on the top edge of the open top side of the quartz container. In an alternative embodiment, the L-shaped structure 46 is positioned so that the top side of the contacting member of the L-shaped structure 46 is in the same plane as the top edge of the quartz container. A weld to the top edge of the quartz container 52 forms a superior weld compared to the weld used in the fixed weir overflow bath system with gutter. In forming a weld, heat is applied to the structures which are to be welded together. In the present invention, heat is applied to the top edge 52 of the quartz container and the edge of the L-shaped member 54 which it is to be welded to. Because heat is applied to the ends of the two structures, heat is more evenly transferred then when the weld is made below the container edge. When the weld is made below the container edge as in the prior art, heat transfers bidirectionally along the surface of the quartz container, making it harder to heat the weld point accurately.

In the preferred embodiment, the L-shaped structure 46 is positioned above the quartz container 48 at a 90° angle with the contacting side of the quartz container. In order to seal the weld, a glass rod is heated adjacent to the edge of one member of the L-shaped structure 46 and the top edge 52 of the quartz container 48. As heat is applied the end of the glass rod, the edges of the L-shaped structure 46 and quartz container melt together to form a homogenous seal. Because the ends of the L-shaped structure 46 and the top edge 52 of the quartz container are not positioned to meet at the corners, a portion of the melted glass rod fills the space between the two structures to form a corner.

After the gutter region 60 is formed by welding an L-shaped structure 46 to the quartz container 48, a resilient material 50 is placed on top of the corner edge 62 formed where the gutter 60 is welded to the quartz container 48. Next the removable weir 44 is placed on top of the resilient material 50. The resilient material 50 may be attached to the corner edge of the outer container with gutter 42 or to the removable weir 44 by an adhesive. Pressure is applied to the top of the removable weir 44 so that the resilient material 50 conforms to the top corner edge 62 of the outer container with gutter 42 and the bottom and sides of the removable weir 44 so that a seal is formed. The seal prevents fluid from passing between the sides of the removable weir 44 and the interior walls of the quartz container 48. Together the interior walls of the quartz container, the resilient material and interior walls removable weir form the processing region 64 of the bath system.

Fluid should flow only over the scalloped edges of the removable weir 44 into the gutter region 60 of the outer container with gutter 42. In order for fluid to flow from the processing region 64 into the gutter region 60, the gutter region 60 must be at a lower level than the scalloped edges of the removable weir 44. More specifically, the weld point 52 of the L-shaped structure 46 must be below the bottommost edge of the scallops of the removable weir 44.

The fit of the resilient material 50 between the removable weir 44 and the corner edge 62 of the outer container with gutter must be such that fluid does not flow in between the sides of the two structures, but flows only over the scalloped edges of the removable weir 44 into the gutter region 60. A good material to accomplish a liquid tight seal between the two structures is Gortex sealant. Gortex is a registered trademark of the W.L. Gore Company of Elkton, Md. Another good alternative sealant material is Calrez which is manufactured by the DuPont Company of Wellington, Del.

Operation of the present invention is similar to the fixed weir overflow bath system with gutter illustrated in FIGS. 1–3. The processing region 64 is filled with a chemical. As more chemical is pumped into the processing region 64, the chemical overflows the four sides of the removable weir 44 into the gutter 60. Particulate, which typically contaminate the solvent by falling onto the surface of the solvent, are trapped by the surface tension and are removed by the overflow action into the gutter 60 before the particulate can sink into the liquid and contaminate the solvent. The gutter region has a drain (not shown) through which the chemical is removed, filtered and pumped back into the inner container.

Figures 6, 6A:
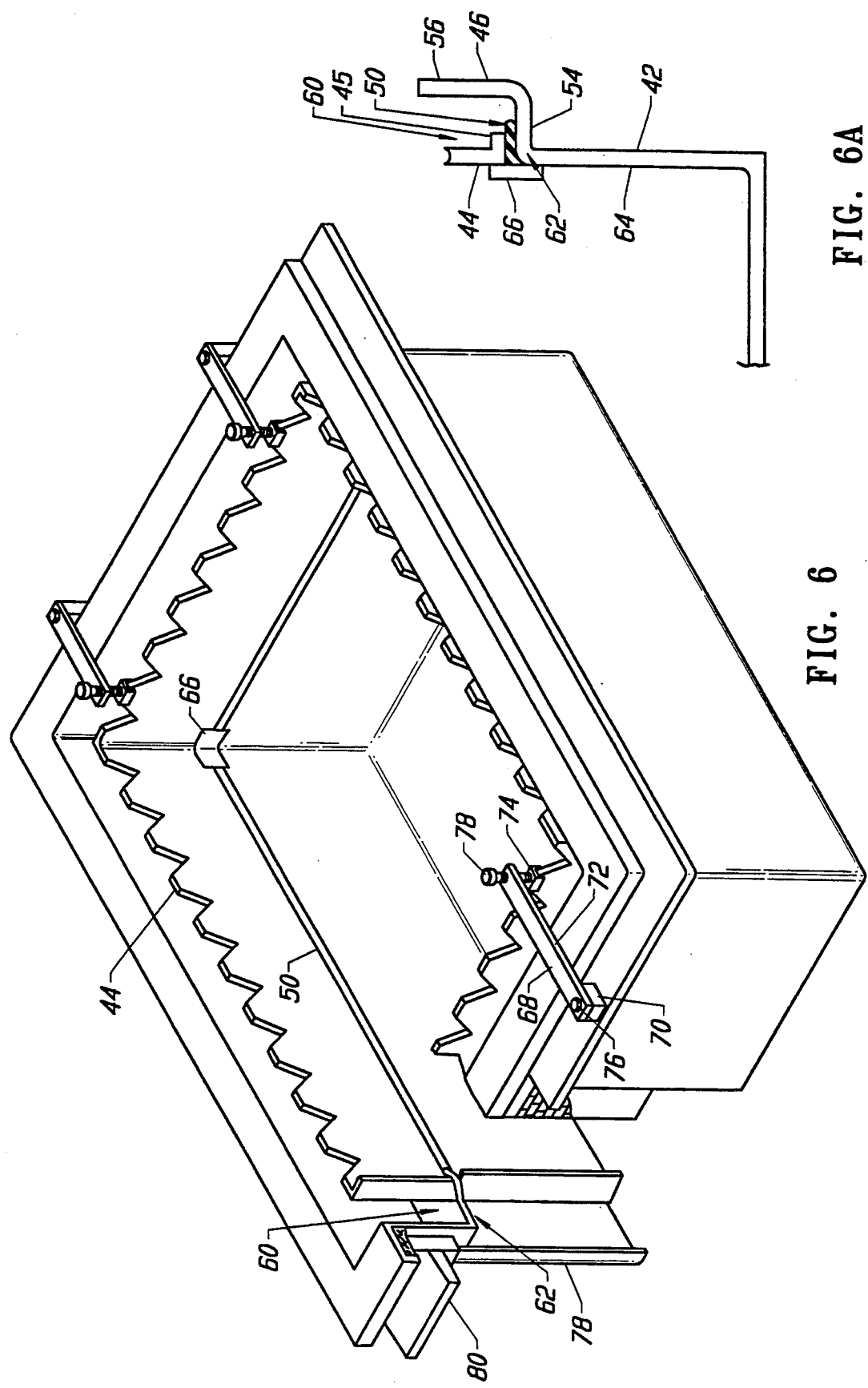
FIG. 6 is a part perspective part cross-sectional view of the removable weir bath system with gutter according to the present invention.
FIG. 6A is a cross-sectional view of the overflow bath system with gutter according to the present invention.

In order to provide stabilize and prevent horizontal movement of the removable weir 44 during bath system operation, weir posts 66 are welded to the bottom interior corners of the removable weir 44. Referring to FIGS. 6 and 6A, these weir posts 66 prevent the removable weir 44 from sliding past the interior sides of the quartz container. The corner weir posts 66 also help align the placement of the resilient material 50 used to form a seal between the removable weir 44 and quartz container. The resilient material 50 is placed on top the corner edges of the quartz container, therefore the weir posts 66 help keep the resilient material properly within the corners of the container.

To further stabilize the position of the removable weir 44 and prevent vertical movement of the weir 44, weir locks 68 are placed at the four corners of the bath system. The weir locks 68 are comprised of a vertical post 70, a horizontal bar 72, a weir bracket 74, and first and second screws 76 and 78. In the preferred embodiment of the weir lock 68, a first screw 76 secures the vertical post 70 and horizontal bar 72 to a flange 80 of the polyurethane housing 82 which encases the bath system. The horizontal bar 72 extends inward from the flange 80 to the removable weir 44. A bracket 74 rests on top of the weir. A second screw 78 extends from a hole in the horizontal bar to the weir bracket 74. As the second screw 78 is screwed downward, vertical pressure is applied to the removable weir 44 improving vertical stabilization.

The outer container with gutter 42 is divided into an upper and lower region. The open top quartz container 48 forms the lower tank region. The L-shaped structure 46 welded to the top edge of the quartz container forms the upper tank or gutter region. Heating elements in the form of strips are placed along the sides and bottom of the lower tank region 48. Typically these heating elements are bound directly to the sides of the container. The heating elements are encased by the polypropylene housing 78 which houses and protects the bath system. Frequently, however, these heating elements do not remain in direct contact with the container surface and air pockets form. Each air pocket acts as an insulator, and therefore heat transfer cannot occur between the heating element and the container. Because heat cannot be transferred from the heating element, burnout of the heating element and the surrounding area occurs.

The present invention eliminates this problem by separating the heating elements from the sides of the container with a heat conducting material such as Dow 31-45 or another Room Temperature Vulcanized (RTV) material. The heating elements are embedded in the heat conducting material which is adhered to the container walls. The distance is such that the heating elements are close enough to the container walls that heat may be easily transferred to the container surface. The heating elements are pressed into the RTV heat conducting material so that they are buried within the RTV material. The RTV heat conductive material is pressed and attached to the container sides and bottom wherever heating is desired. Because the material conforms to the surface of the container, no air pockets are formed and burn out does not result.

The present invention offers the advantages of the fixed weir overflow bath system with gutter with a more simplistic method of manufacture. Like other guttered bath systems the volume of chemicals used in the bath system is decreased because chemical flow does not flow into the outer tank but into the gutter region. Because the volume of chemicals is decreased, heating costs are also reduced.

The weld to the top edges of the two structures reduces stress compared to the weld illustrated in FIGS. 1-3 and is therefore less prone to breakage. A stronger weld reduces the probability of breakage. This probability of breakage is critical, since breakage caused by a weak weld is often not repairable and results in the disposal of the quartz container.

The weld to the top edge of the quartz container instead of the laser scalloped lower tank as in the prior art, prevents loss of the expensive laser scalloped tank in the event of breakage. Also the probability of breakage is reduced due to the position of the weld to the top edge of the container.

The present invention gives the user increased flexibility because the user may easily remove the weir and replace it with another weir which has scallops which meet the desired required processing characteristics. Thus the user need not buy a new bath system to change the scallop characteristics, but needs simply replace the removable weir.

Thus, while the invention has been particularly shown and described with reference to the preferred embodiments, it is understood by those skilled in the art that changes in form and details may be made without departing from the spirit of this invention. For example, the gutter region may be C-shaped in cross section and still perform the same functionally. It is therefore intended that an exclusive right be granted to the invention as limited only by the metes and bounds of the appended claims.

What is claimed is:

1. A filtered bath system which comprises:
    a first container;
    a first structure welded to said first container forming a container with gutter, said first structure being L-shaped in cross section, one member of said L-shaped structure being generally parallel to a contacting side of said container with gutter while the other member is generally perpendicular to the contacting side of said container with gutter;
    a second structure having four walls, each wall having two ends, each end joined to an end of another wall, said second structure having an open top and bottom, the top edge of said second structure being scalloped;
    a resilient material placed between said container with gutter and said second structure, said resilient material forming a seal between said container with gutter and said second structure,
    said seal between said container with gutter and said second structure preventing fluid flow between the sides of said container with gutter and said second structure yet allowing fluid flow over said top edge of said second structure into said gutter; and
    a heat conducting material adhered to the said sides and bottom of said first container where heating elements are embedded in said heat conducting material.

2. A semiconductor wafer bath system which comprises:
    a container with one gutter sidewall, said container having an open top side and constructed for receiving a removable second structure atop said container,
    said removable second structure having four walls, each wall having two ends, each end joined to an end of another wall, said second structure having an open top and open bottom and a scalloped top edge to form a container with gutter around said open top side;
    a resilient material placed between said container with one gutter sidewall and said removable structure, said resilient material forming a seal between said container and said removable structure,
    said seal between said container and said removable structure preventing fluid flow between the sides of said container and said removable structure yet allowing fluid flow over said top edge of said removable structure into said gutter; and
    a heat conducting material adhered to the said sides and bottom of said container with gutter where heating elements are embedded in said heat conducting material.

* * * * *